United States Patent [19]

Daeges et al.

[11] Patent Number: 4,888,516

[45] Date of Patent: Dec. 19, 1989

[54] PIEZOELECTRICALLY EXCITABLE RESONANCE SYSTEM

[75] Inventors: Johannes Daeges, Lichtenfels; Klaus Van Der Linden, Kronach, both of Fed. Rep. of Germany

[73] Assignee: Siemens Aktiengesellschaft, Berlin & Munich, Fed. Rep. of Germany

[21] Appl. No.: 222,266

[22] Filed: Jul. 21, 1988

[30] Foreign Application Priority Data

Jul. 22, 1987 [DE] Fed. Rep. of Germany ....... 3724629

[51] Int. Cl.$^4$ .............................................. H01L 41/08

[52] U.S. Cl. .................................. 310/323; 239/102.2; 310/335

[58] Field of Search ................................ 310/321–323, 310/325, 328, 335, 336, 337, 369; 239/102.1, 102.2; 134/1

[56] References Cited

U.S. PATENT DOCUMENTS

| | | | |
|---|---|---|---|
| 3,904,896 | 9/1975 | Guntersdorfer . | |
| 4,474,326 | 10/1984 | Takahashi ....................... | 310/325 X |

FOREIGN PATENT DOCUMENTS

| | | | |
|---|---|---|---|
| 0019210 | 7/1980 | European Pat. Off. ............ | 310/335 |
| 1425897 | 10/1964 | Fed. Rep. of Germany ...... | 310/323 |
| 2557958 | 6/1977 | Fed. Rep. of Germany ...... | 310/323 |
| 3616713 | 5/1986 | Fed. Rep. of Germany . | |
| 434623 | 11/1974 | U.S.S.R. ............................. | 310/369 |

*Primary Examiner*—Mark O. Budd

*Attorney, Agent, or Firm*—Kenyon & Kenyon

[57] ABSTRACT

For generating liquid droplets which may pass into the lungs of a person, a resonance system is used which contains a rotation-symmetrical metal body with a disc-shaped base plate, a working plate, a neck connecting the working plate to the base plate as well as a piezoceramic vibrator. The vibrator is coupled to the plane base surface which extends perpendicularly to the symmetry axis of the metal body. The base plate is also provided with a parabolic reflector surface. The center of the working plate is in the vicinity of the reflector focal point, optionally mirrored with respect to the base area of the base plate, of the parabolic reflector surface. In this design, ultrasound waves excited by the vibrator are focused into the region of the working plate, thereby atomizing a liquid which is held by the working plate.

12 Claims, 1 Drawing Sheet

PIEZOELECTRICALLY EXCITABLE RESONANCE SYSTEM

BACKGROUND OF THE INVENTION

1. Field of Invention

This invention pertains to devices for generating resonance vibrations in the ultrasonic-frequency range, and more particularly to a piezoelectrically excitable resonance system, which can be used to diffuse, spray or atomize liquids.

2. Description of the Prior Art

One device for atomizing liquid described in U.S. Pat. No. 3,904,896 (DE-Al 2,032,433) consists of a metal body having rotational symmetry, and a piezoceramic vibrator coupled to a base area of the metal body. The metal body of this resonance systemm designed for bending excitation has three regions, namely, a disc-shaped base plate, a vibrating plate designating the working plate, and a stem which connects the base plate and the working plate and which coincides with the axis of symmetry of the metal body. The working plate serves, for instance, for containing a liquid. Liquids atomized with such a resonance system have droplet diameters which, generally, are not small enough to penetrate all the way into the lungs of a person. Such a resonance system is therefore not very suitable for atomizing liquids used for inhalation purposes.

For improving the above-mentioned liquid atomizer, it has been proposed in German patent application DE-A-3,616,713 (U.S. Application Ser. No. 049,129) to design the working plate as a concave mirror while the base plate is cone-shaped, and to connect it to the conical base plate via a neck having a special shape. Thereby, very small volumes of liquid (15 microliters or less) can be atomized by using thickness resonance excitation, without a mechanical droplet filter, with a small electric excitation power and without coupling through a liquid medium, to form droplets with a diameter smaller than or equal to 40 micrometers. The vibration frequency of this resonance system is in the megahertz range.

OBJECTIVES AND SUMMARY OF THE INVENTION

It is an object of the invention to provide an improved resonance system which requires a small electric excitation power, and in which droplets can be generated which have diameters smaller than 15 micrometers. Droplets of this size penetrate into lungs easier than droplets of larger diameters.

According to the invention a piezoceramic resonance system comprises a resonance vibrator attached to a base plate having a parabolic cover or reflector surface opposite a base area, and a working plate which is disc or shell-shaped. The center of the working plate is located at the focal point or in the vicinity of the focal point of the parabolic cover or reflector surface. PARABOLIC REFLECTOR SURFACE is understood to mean within the scope of the invention, a surface which reflects incident ultrasonic waves toward a focal point. Such a surface may be approximated by a spherical surface or a surface generated by a paraboloid of ring-shaped subsurfaces (i.e., a plurality of truncated cone surfaces with different cone aperture angles). Reflection toward the focal point may be direct or via the base plate, as will become more obvious later.

In a resonance system designed in this manner, the ultrasonic waves generated by the piezoceramic vibrator in a direction transversal to a major axis of the vibrator are injected into the metal body. They are reflected at the parabolic reflector surface of the base plate and are focused through the neck into the region of the working plate. Since the ultrasonic waves strike the working plate at an angle of inclination, part of these sound waves is reflected in the direction of the rim of the working plate or proceeds as a surface wave in the direction of the rim. Thereby, a uniform distribution of the liquid to be atomized on the working plate and a uniform atomization over the entire atomizing time are obtained. In addition, the liquid surface is located in the vicinity of the optimum atomizing point during the entire atomizing operation. Consequently, devices can be produced with an excitation power smaller than or equal to 20 W, in which more than 50% of the atomized liquid comprises droplets of 15 micrometers or less. Typically, the most frequent droplets may have a diameter smaller than or equal to 5 micrometers which is excellent for inhalation purposes. Furthermore, a given resonance frequency may be obtained since manufacturing tolerances of the resonance system may easily be controlled.

In a further embodiment of the invention, the metal body of the resonance system can be designed so that the base surface of the base plate is a circular ring and the base plate includes a transition into a conical neck which passes through the opening of the circular ring and extends above the base plate. Thereby, a relatively compact design is obtained for the resonance system. In this latter case, the piezoceramic thickness vibrator has likewise the form of a circular ring.

In this embodiment, the working plate may be integrated directly in the neck, the neck being designed as a truncated cone with a disc or shell-shaped depression or cavity at the tapered end. In this embodiment, the focal point of the ultrasonic waves can be placed in the cavity of the cone apex and thereby directly in the liquid to be atomized.

The resonator may also be designed so that the conical neck is provided at the tapered end with an enlargement to form the disc-shaped working plate. This makes it possible to atomize a larger quantity of liquid.

A particularly advantageous embodiment of the metal body comprises a base plate which changes into the neck supporting the disc-shaped working plate on the side of the parabolic cover surface in the vicinity of the axis of symmetry. In this embodiment, the ultrasonic waves are reflected twice before they strike the working plate. Interference effects, beam offsets (see German periodical "Materialprüfung", 1965, pages 281 et al.) and reentrance of the ultrasonic waves into the piezoceramic vibrator associated with this double reflection lead to parallel beam displacements, whereby the feeding or coupling of the ultrasound into the liquid to be atomized is improved. This can be further improved by a special design of the working plate. This design consists in that the side portion of the disc-shaped working plate forms a conical surface. The transition zone between the neck and the disc-shaped working plate and the inclination of the side part relative to the middle part of the disc-shaped working plate are chosen so that sound waves reflected at the disc-shaped working plate are directed into the side part and then back to the liquid-plate interface. These multiple reflections improve the efficiency of the resonance system.

The dimensions of the resonance system depend on the velocity of sound in the metal body, which preferably consists of chrome-nickel steel, and on the desired frequency which should be in the most advantageous transmission range of the piezoceramic thickness vibrator. Since the continuous atomization of a liquid is preferably accomplished with standing ultrasonic waves, the ultrasound travel distance in the metal body should be a multiple of half a wavelength. For example, the ultrasound travel distance may be 6 to 28 times its half wavelength.

In view of the design with double reflection of the ultrasonic waves, the thickness of the base plate should be about twice the ultrasound wavelength, and the diameter of the disc-shaped working plate should be about three times this wavelength. The diameter of the base area of the disc-shaped base plate should be approximately ten times the wavelength. The height of the neck, i.e. the distance between the apex of the parabolic cover surface and the center of the disc-shaped working plate, should advantageously correspond to one wavelength.

DETAILED DESCRIPTION OF THE DRAWINGS

Figure 1:
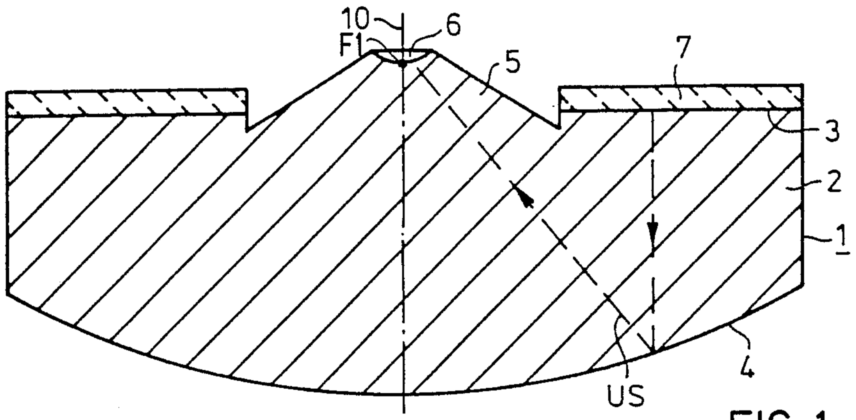
FIG. 1 shows a resonance system according to the invention with a single reflection, and with a working plate being integral with the neck.

FIG. 1 shows a vibrating or resonance system which consists of a metal body 1 with rotational symmetry, preferably made out of chrome-nickel steel, and a piezoceramic vibrator 7. The axis of symmetry is designated 10. The vibrator 7 generates ultrasonic waves in a direction transversal to its major axis, upon excitation in response to an AC signal (thickness excitation). Geometrically, the one-piece metal body 1 may be considered as an annular member which is penetrated by a cone with a paraboloidal bottom surface, the annular part and the cone having the same axis 10 of symmetry and the same outside diameter. Thus, this metal body 1 has a disc-shaped base plate 2 with a planar base surface 3 extending perpendicularly to the axis 10 of rotation, and a parabolic reflector surface 4 opposite thereto. The body 1 further includes a conically tapered neck 5 which penetrates the annular base surface 3 and reaches beyond its plane. The neck 5 is designed at the acutely tapered end with a disc or shell-shaped depression 6. The depression 6 forms the working plate of the resonance system and is designed for receiving a liquid to be atomized. The center of the depression 6 is located at the focal point F1 of surface 4 or in the proximity thereof. The piezoceramic ultrasound transducer or vibrator 7 of annular configuration is attached or coupled to the planar base surface 3 which is arranged vertically with respect to the symmetry axis 10. The transducer 7 is positioned symmetrically with respect to axis 10. During operation it works in the so-called thickness resonance excitation mode, as is conventional in ultrasound techniques.

An ultrasound wave US generated by the piezoceramic vibrator 7 upon electrical excitation is propagated into body 2, is reflected at the parabolic reflector surface 4 and is thereby focused in the direction toward the shell-shaped depression 6. In the focal point F1, i.e. basically in the entire region of depression 6, wave US leads to an atomization of the liquid, thereby generating a multiplicity of droplets having a very small diameter, such as 15 or 5 micrometers or even less.

Figure 2:
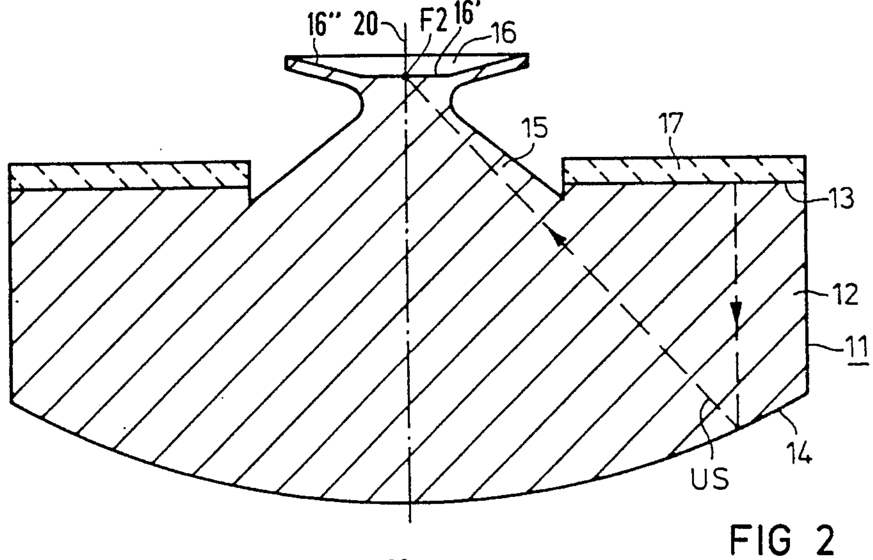
FIG. 2 shows a resonance system according to the invention with a single reflection, and with a working plate being formed at the neck as a disc-like member.

In the embodiment of FIG. 2, the resonance system is similar to the embodiment of FIG. 1, i.e. it comprises a one-piece metal body 11 of rotational symmetry with respect to an axis 20. The body 11 consists of a disc-shaped base plate 12 with a planar annular base surface 13, a parabolic reflector surface 14 at the opposite side thereof, and a conically tapered neck 15. Again the neck 15 extends beyond the surface 13. The working plate is provided here by a disc-shaped enlargement or member 16 which is formed at the acutely tapered end of the neck 15, as shown, at or near the focal point F2 of surface 14. The disc-shaped part 16 has a planar middle portion 16′ and a conical side portion or side wall 16″. The resonance system is excited by energizing a piezoceramic ring body 17 which is coupled or cemented to the body 11 (prefereably of chrome-nickel steel) at surface 14, e.g. by bonding. Again body 17 works in the ultrasound thickness mode. An ultrasound wave US excited by the piezoceramic vibrator 17 is reflected at the parabolic reflector surface 14 and is focused into focal point F2, i.e. into the vicinity of the center of the disc-shaped working plate 16. As a consequence, the liquid on working plate 16 is atomized to form an aerosol.

Figure 3:
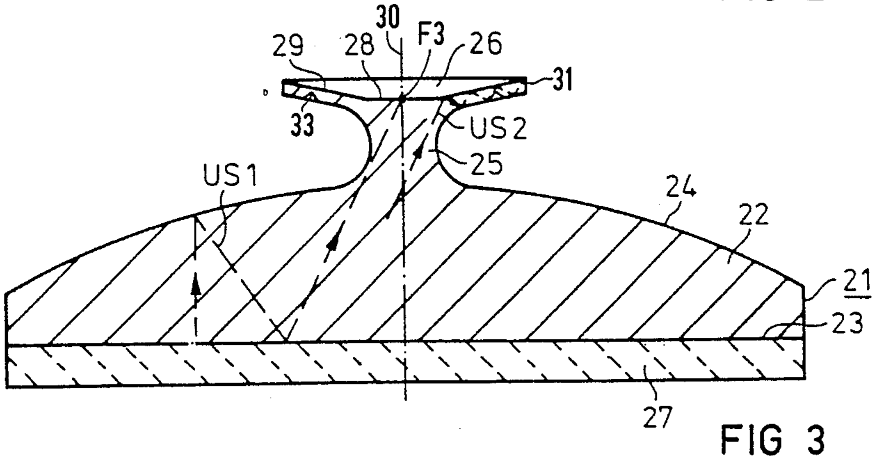
FIG. 3 shows an embodiment according to the invention in which the ultrasound waves are reflected twice before they strike a disc-shaped working plate adjacent to the neck.

In the embodiment shown in FIG. 3, a lower surface 23 of a disc-shaped base plate 22 of a metal body 21 is designed as a plane circular area. The opposite side is designed as a parabolic reflector surface 24. The base plate 22 becomes a neck 25 and a subsequently disc-shaped enlargement serving as working plate 26 above the parabolic reflector surface 24 in the vicinity of the symmetry axis 30. This working plate 26 has a planar central portion 28 and a conical side or wall portion 29. The whole resonance system is symmetrical with respect to symmetry axis 30. A piezoceramic vibrator 27 is of circular or cylindrical shape and is cemented and coupled to the plane base surface 23 as shown. An ultrasound wave US1 excited by the thickness vibrator 27 is reflected at the parabolic reflector surface 24 as well as at the boundary surface 23 between the thickness vibrator 27 and the base plate 22. It is focused toward the center of the disc-shaped working plate 26. In this embodiment, the focal point F3 of the ultrasonic waves is therefore reflected by the interface 23 to a point behind the parabolic surface 24. In other words: In this embodiment focal point F3 of ultrasound wave US1 and location of atomization are located at the same side of plane surface 23.

As the ultrasound waves are reflected at the boundary surface between the thickness vibrator 27 and the base plate 22, interference phenomena and beam dislocations occur which lead to parallel shifts of the ultrasound waves, such as, for instance, to ultrasound wave US2. Due to the angle of inclination between the incident ultrasound waves and the disc-shaped working plate 26, a first portion of the respective ultrasound wave penetrates the liquid applied to the working surface 26; a second portion proceeds as a surface wave in the direction toward the rim 31 of the disc; a third part is reflected at the boundary surface. A portion of the reflected third component is reflected by the bottom wall 29 of working plate 26 to the rim 31, as shown in dashed lines. A circular ring-shaped notch 33, preferably on the underside of the disc wall, in the vicinity of the disc rim 31 shields the disc rim 31 against the ultrasound wave, thereby calming down the liquid located on the working plate 26 in the vicinity of the rim 31.

Instead of using a rim 33, the outer portion of wall 29 may have a thickness different from this inner portion thereof. Another possibility for calming down the liquid without using a rim 33 resides in a structure wherein the rim 31 is disposed in an obtuse angle with respect to the underside of wall 29.

For a working plate 26 holding about 15 microliters of a liquid for atomizing, it has been found that the plate diameter should be about three times the wavelength of the ultrasound wave US in the body 21, the neck 25 and the central portion 28 should have a diameter of about one wavelength, and the neck 25 should have a height of about one wavelength; the base plate 22 should have a thickness of twice the wavelength, and the diameter of the base area 23 should be about ten times the wavelength. The thickness of the piezoceramic vibrator 27 should preferably correspond to approximately one-half the wavelength of the excited ultrasound wave in the thickness vibrator 27. The droplets generated by a such a system may easily pass into the lungs of a person or patient.

While the forms of the ultrasound resonance system described herein constitute preferred embodiments of the invention, it is to be understood that the invention is not limited to these precise forms of assembly, and that a variety of changes may be made therein without departing from the scope of the invention.

What is claimed is:

1. A piezoelectrically excitable resonance system for atomizing a liquid, comprising:

a metal body with rotational symmetry and capable of vibrating, said body including a disc-shaped base plate having a parabolic surface with a focal point, a working plate disposed at least in the vicinity of said focal point for holding said liquid, and a neck connecting the working plate to the base plate; and a piezoceramic vibrator which is coupled to a plane base surface of the base plate perpendicular to the axis of symmetry, said piezoceramic vibrator operating as a thickness resonance vibrator.

2. The resonance system according to claim 1, wherein said base plate has a base surface shaped as a circular ring and makes a transition into a conical neck which passes through the opening of the circular ring beyond the base surface.

3. The resonance system according to claim 2, wherein said neck is formed as a truncated cone tapered at an acute angle and having a disc-shaped depression.

4. The resonance system according to claim 2, wherein the conical neck makes a transition to an enlarged disc-shaped working plate.

5. The resonance system according to claim 1, wherein the disc-shaped base plate makes a transition to the neck supporting the disc-shaped working plate on the side of the parabolic surface in the vicinity of the axis of symmetry.

6. The resonance system according to claim 5, wherein the disc-shaped working plate has a conical side part and the transition region between the neck and the disc-shaped working plate as well as the inclination of the side part relative to the central part of the disc-shaped working plate are arranged and constructed for multiple ultrasonic reflections.

7. The resonance system according to claim 6, wherein the side part is provided with a circular notch in the vicinity of the rim of the disc.

8. The resonance system according to claim 5, wherein the thickness of the disc-shaped base plate is about twice the wavelength of the ultrasound in the base plate.

9. The resonance according to claim 5, wherein the diameter of the disc-shaped working plate is about three times the ultrasound wavelength.

10. The resonance system according to claim 5, wherein the diameter of the base area of the base plate is approximately ten times the ultrasound wavelength.

11. The resonance system according to claim 5, wherein the diameter of the neck is approximately equal to one ultrasound wavelength.

12. The resonance system according to claim 5, wherein the height of the neck corresponds approximately to one wavelength of the ultrasound.

* * * * *